(12) United States Patent
Hirayama (10) Patent No.: US 8,111,537 B2
(45) Date of Patent: Feb. 7, 2012

(54) SEMICONDUCTOR MEMORY

(75) Inventor: Tomohisa Hirayama, Kawasaki (JP)

(73) Assignee: Fujitsu Semiconductor Limited, Yokohama (JP)

( * ) Notice: Subject to any disclaimer, the term of this patent is extended or adjusted under 35 U.S.C. 154(b) by 0 days.

(21) Appl. No.: 11/484,740

(22) Filed: Jul. 12, 2006

(65) Prior Publication Data

US 2007/0217249 A1 Sep. 20, 2007

(30) Foreign Application Priority Data

Mar. 17, 2006 (JP) ................. 2006-075323

(51) Int. Cl.
  G11C 11/22 (2006.01)
  G11C 11/24 (2006.01)
  G11C 8/00 (2006.01)
(52) U.S. Cl. ............ 365/145; 365/149; 365/230.06
(58) Field of Classification Search .......... 365/145, 365/149, 230.06
  See application file for complete search history.

(56) References Cited

U.S. PATENT DOCUMENTS

| | | | | |
|---|---|---|---|---|
| 4,852,066 A * | 7/1989 | Kai | ............ | 365/230.06 |
| 4,873,664 A * | 10/1989 | Eaton, Jr. | .............. | 365/145 |
| 5,381,379 A * | 1/1995 | Fukumoto | .............. | 365/145 |
| 5,400,275 A * | 3/1995 | Abe et al. | .............. | 365/145 |
| 5,430,671 A * | 7/1995 | Hirano et al. | .............. | 365/145 |
| 5,889,696 A * | 3/1999 | Kawakubo et al. | .......... | 365/145 |
| 5,940,316 A * | 8/1999 | Koike | .............. | 365/145 |
| 6,038,162 A * | 3/2000 | Takata et al. | .............. | 365/145 |
| 6,046,926 A * | 4/2000 | Tanaka et al. | .............. | 365/145 |
| 6,111,777 A * | 8/2000 | Ogiwara et al. | .......... | 365/145 |
| 6,154,387 A * | 11/2000 | Takata | .............. | 365/145 |
| 6,191,971 B1 * | 2/2001 | Tanaka et al. | .............. | 365/145 |
| 6,301,145 B1 * | 10/2001 | Nishihara | .............. | 365/145 |
| 6,317,380 B1 * | 11/2001 | Kang | .............. | 365/145 |
| 6,754,095 B2 * | 6/2004 | Tanaka et al. | .............. | 365/145 |
| 6,771,531 B2 * | 8/2004 | Nishihara | .............. | 365/145 |
| 6,888,766 B2 * | 5/2005 | Takahashi | .............. | 365/145 |
| 6,914,799 B2 * | 7/2005 | Takahashi et al. | .......... | 365/145 |
| 6,930,908 B2 * | 8/2005 | Hoya et al. | .............. | 365/145 |
| 6,967,891 B2 * | 11/2005 | Nishihara | .............. | 365/145 |
| 7,002,836 B2 * | 2/2006 | Nishihara | .............. | 365/145 |
| 7,016,215 B2 * | 3/2006 | Kamoshida et al. | .......... | 365/145 |
| 7,031,180 B2 * | 4/2006 | Karasawa et al. | .......... | 365/145 |
| 7,038,938 B2 * | 5/2006 | Kang | .............. | 365/145 |
| 7,042,754 B2 * | 5/2006 | Mukaiyama | .............. | 365/145 |
| 7,057,917 B2 * | 6/2006 | Ogiwara et al. | .......... | 365/145 |
| 7,130,208 B2 * | 10/2006 | Nishihara | .............. | 365/145 |
| 7,142,444 B2 * | 11/2006 | Nishihara et al. | .......... | 365/145 |
| 7,154,766 B2 * | 12/2006 | Oikawa et al. | .............. | 365/145 |
| 7,203,086 B2 * | 4/2007 | Nishihara et al. | .......... | 365/145 |

FOREIGN PATENT DOCUMENTS

JP 2001-358312 12/2001

* cited by examiner

*Primary Examiner* — Trong Phan
(74) *Attorney, Agent, or Firm* — Arent Fox LLP (57) ABSTRACT

A semiconductor memory that includes a memory cell array by which power consumption can be reduced and that enables a reduction in circuit area. In the memory cell array, each of capacitor plate lines is arranged so as to connect with ferroelectric memory cells in a same row, and each of word lines is arranged so as to connect with ferroelectric memory cells in different rows in a column direction. In addition, of drive circuits for driving the capacitor plate lines and the word lines, part of word line drive circuits (WL drive circuits) are arranged in the column direction. Therefore, it is possible to drive all of the word lines without using a dummy area. As a result, circuit area can be reduced.

14 Claims, 9 Drawing Sheets

SEMICONDUCTOR MEMORY

CROSS-REFERENCE TO RELATED APPLICATIONS

This application is based upon and claims the benefits of priority from the prior Japanese Patent Application No. 2006-075323, filed on Mar. 17, 2006, the entire contents of which are incorporated herein by reference.

BACKGROUND OF THE INVENTION (1) Field of the Invention

This invention relates to a semiconductor memory, and more particularly, to a semiconductor memory having ferroelectric memory cells.

(2) Description of the Related Art

A flash memory and a ferroelectric memory are known as nonvolatile memories which can store information after power is turned off.

A flash memory has a floating gate embedded in a gate insulating film of an insulated gate field-effect transistor (IGFET) and stores information by accumulating electric charges indicative of the information in this floating gate. With a flash memory, however, a tunnel current must be passed through a gate insulating film to write or erase information. Accordingly, a comparatively high voltage must be applied.

On the other hand, a ferroelectric memory is also known as a ferroelectric random access memory (FeRAM) and stores information by making use of the hysteresis characteristic of a ferroelectric film included in a ferroelectric capacitor. This ferroelectric film polarizes according to voltage applied between an upper electrode and a lower electrode of the capacitor. Even after the voltage is removed, spontaneous polarization remains. When the polarity of the applied voltage is reversed, the direction of the spontaneous polarization is also reversed. Therefore, by associating the directions of the spontaneous polarization with "1" and "0," information is written to the ferroelectric film. Voltage necessary for this writing is lower than voltage applied to a flash memory. In addition, high-speed writing can be performed compared with a flash memory.

In order to reduce the power consumption of a ferroelectric memory including memory cells each having such a ferroelectric capacitor, the following memory cell array in which word lines are arranged like stairs is disclosed (see, for example, Japanese Unexamined Patent Publication No. 2001-358312).

Figure 7:
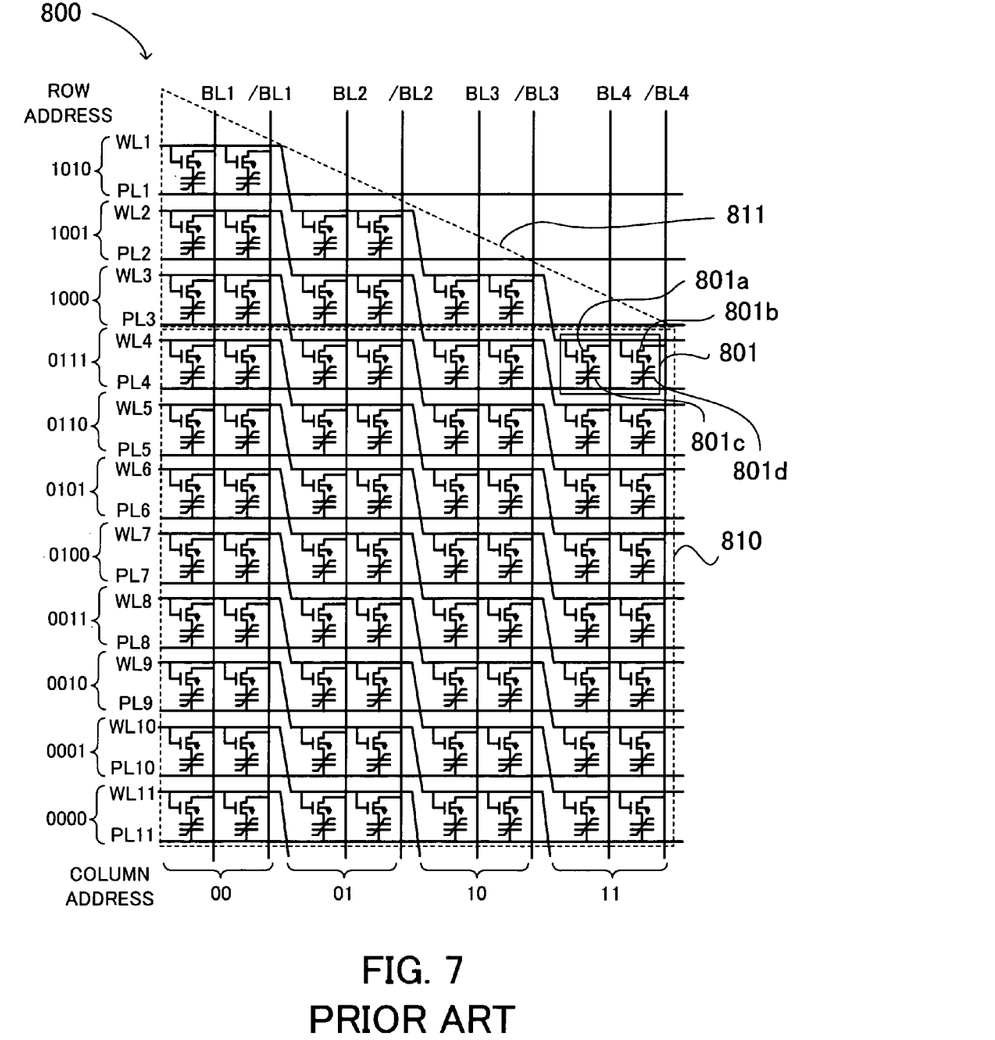
FIG. 7 shows an example of a memory cell array included in a conventional ferroelectric memory.

FIG. 7 shows an example of a memory cell array included in a conventional ferroelectric memory.

A memory cell array 800 includes a plurality of memory cells arranged in a matrix form, bit lines BL1, BL2, BL3, and BL4 and complementary bit lines /BL1, /BL2, /BL3, and /BL4 arranged in a column direction, and word lines WL1, WL2, WL3, WL4, WL5, WL6, WL7, WL8, WL9, WL10, and WL11 and capacitor plate lines PL1, PL2, PL3, PL4, PL5, PL6, PL7, PL8, PL9, PL10, and PL11 arranged in a row direction. The word lines WL1 through WL11 are arranged like stairs so that each of them will connect with ferroelectric memory cells in different rows in the column direction.

Each memory cell includes, for example, two metal oxide semiconductor (MOS) transistors and two ferroelectric capacitors and is what is called a 2T2C cell. For example, a memory cell 801 includes MOS transistors 801a and 801b and ferroelectric capacitors 801c and 801d. One input-output terminal of the MOS transistor 801a is connected to the bit line BL4 and one input-output terminal of the MOS transistor 801b is connected to the complementary bit line /BL4. The other input-output terminal of the MOS transistor 801a is connected to one terminal of the ferroelectric capacitor 801c and the other input-output terminal of the MOS transistor 801b is connected to one terminal of the ferroelectric capacitor 801d. Gates of the MOS transistors 801a and 801b are connected to the word line WL1. The other terminal of the ferroelectric capacitor 801c and the other terminal of the ferroelectric capacitor 801d are connected to the capacitor plate line PL4.

An area in the memory cell array 800 including (8×4) memory cells from the bottom is a real memory area 810 really used for memory access. An area above the real memory area 810 is a dummy area 811. The structure of a memory cell array in the dummy area 811 is the same as that of a memory cell array in the real memory area 810. However, the dummy area 811 is not used for memory access but used for arranging the word lines WL1, WL2, and WL3 which connect with memory cells in the real memory area 810.

It is assumed that the memory cell 801 located at the row address "0111" and the column address "11" is selected from the memory cell array 800 having the above structure.

To select the memory cell 801, the capacitor plate line PL4 located at the row address "0111" is driven by a capacitor plate line drive circuit (not shown). To select one of the word lines WL1 through WL11 to be driven, the following conversion must be made because the word lines WL1 through WL11 are arranged like stairs.

To select the memory cell 801 located at the row address "0111" and the column address "11," an adder (not shown) adds these addresses together. "0111"+"11"="1010," so a word line drive circuit (not shown) drives the word line WL1 located at the row address "1010". As a result, the memory cell 801 is selected.

When the word line WL1 is driven, the MOS transistors 801a and 801b included in the memory cell 801 go into the ON state. When data is written, voltage is applied between the bit line BL4 or the complementary bit line /BL4 and the capacitor plate line PL4. By doing so, the predetermined data (polarization direction) is written to the ferroelectric capacitors 801c and 801d. The memory cell 801 is a 2T2C cell. Therefore, if "1" is stored in the ferroelectric capacitor 801c, then "00" is stored in the ferroelectric capacitor 801d. The word line WL1 is driven again at read time. The MOS transistors 801a and 801b go into the ON state. The data is read out by amplifying the difference in potential between the bit line BL4 and the complementary bit line /BL4 electrically connected to the ferroelectric capacitors 801c and 801d respectively with a sense amplifier (not shown).

With the memory cell array 800 having the above structure, the number of ferroelectric memory cells simultaneously selected is one when the capacitor plate line PL4 and the word line WL1, for example, are activated. Therefore, power consumption can be reduced and high-speed operation can be realized.

Figure 8:
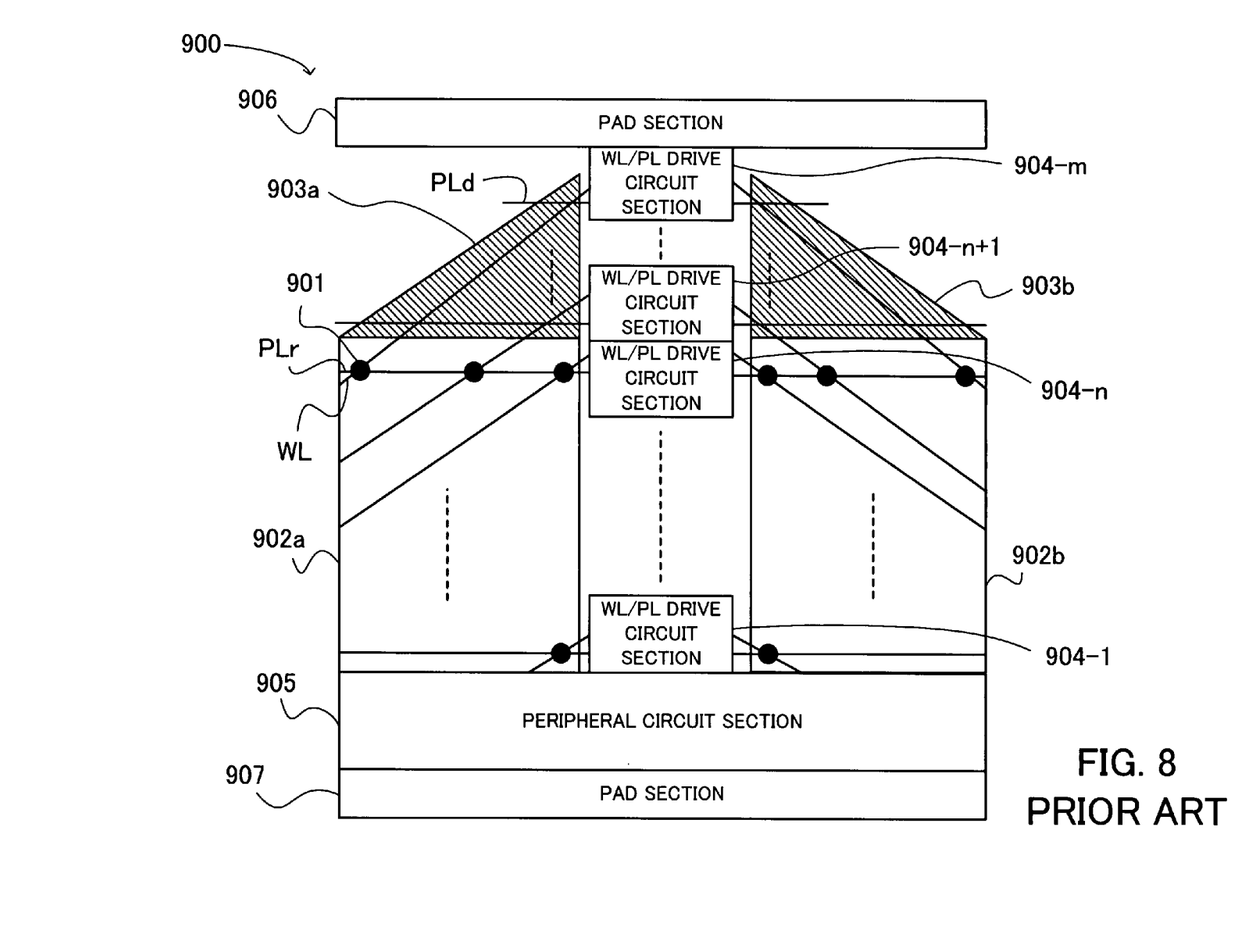
FIG. 8 is a schematic view showing the structure of a conventional semiconductor memory having ferroelectric memory cells.

FIG. 8 is a schematic view showing the structure of a conventional semiconductor memory having ferroelectric memory cells.

In FIG. 8, each black dot indicates a memory cell 901. A word line WL connected to the memory cell 901 is actually arranged like stairs. This is the same with the word lines WL1 through WL11 shown in FIG. 7. In FIG. 8, however, the word line WL is simplified by using a slant line. Bit lines (including complementary bit lines) are not shown.

A semiconductor memory 900 has a memory cell array including a real memory area 902a and a dummy area 903a and a memory cell array including a real memory area 902*b* and a dummy area 903*b*. Memory cells are not shown in the dummy areas 903*a* and 903*b*.

WL/PL drive circuit sections 904-1, . . . , 904-*n*, 904-(*n*+1), . . . , 904-*m* for driving word lines WL and capacitor plate lines PL are arranged between the two memory cell arrays.

The WL/PL drive circuit sections 904-1 through 904-*n* drive capacitor plate lines PLr and word lines WL in the real memory areas 902*a* and 902*b*. The WL/PL drive circuit sections 904-(*n*+1) through 904-*m* drive word lines WL for selecting part of the memory cells in the real memory areas 902*a* and 902*b*. The WL/PL drive circuit sections 904-(*n*+1) through 904-*m* are connected to capacitor plate lines PLd in the dummy areas 903*a* and 903*b*, but the WL/PL drive circuit sections 904-(*n*+1) through 904-*m* are not used for driving the capacitor plate lines PLd. Accordingly, the memory cells in the dummy areas 903*a* and 903*b* cannot be selected.

The semiconductor memory 900 also has a peripheral circuit section 905 including a sense amplifier, an adder, a column selection circuit, a timing generation circuit, and a decoder for selecting a word line WL or a capacitor plate line PLr to be driven and pad sections 906 and 907 for inputting various kinds of voltages and outputting a signal read out from a memory cell 901.

Each of the WL/PL drive circuit sections 904-1 through 904-*m* includes a word line drive circuit and a capacitor plate line drive circuit. The structure of the word line drive circuit is approximately the same as that of the capacitor plate line drive circuit. The structure of an example of a word line drive circuit 910 will now be described.

Figure 9:
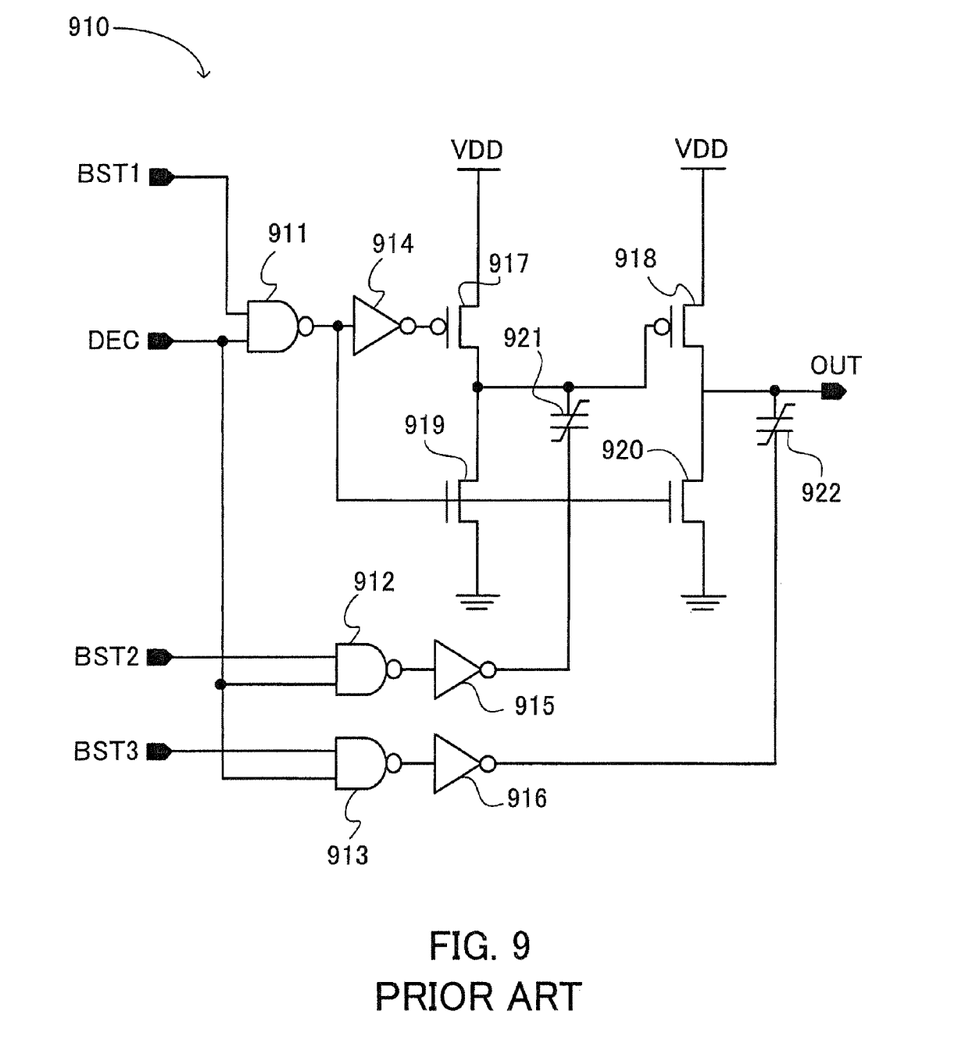
FIG. 9 is a circuit diagram of an example of a conventional word line drive circuit.

FIG. 9 is a circuit diagram of an example of a conventional word line drive circuit.

The word line drive circuit 910 includes NAND circuits 911, 912, and 913, inverter circuits 914, 915, and 916, p-channel MOS transistors (PMOSes) 917 and 918, n-channel MOS transistors (NMOSes) 919 and 920, and ferroelectric capacitors 921 and 922.

One input terminal of the NAND circuit 911 is connected to a step-up terminal BST1. One input terminal of the NAND circuit 912 is connected to a step-up terminal BST2. One input terminal of the NAND circuit 913 is connected to a step-up terminal BST3. The respective other input terminals of the NAND circuits 911, 912, and 913 are connected to a decode terminal DEC.

An output terminal of the NAND circuit 911 is connected to gates of the NMOSes 919 and 920 and is connected to a gate of the PMOS 917 via the inverter circuit 914. An output terminal of the NAND circuit 912 is connected to one terminal of the ferroelectric capacitor 921 via the inverter circuit 915. An output terminal of the NAND circuit 913 is connected to one terminal of the ferroelectric capacitor 922 via the inverter circuit 916.

Power supply voltage VDD is applied to one input-output terminal of the PMOS 917. The other input-output terminal of the PMOS 917 is connected to one input-output terminal of the NMOS 919, the other terminal of the ferroelectric capacitor 921, and a gate of the PMOS 918. The other input-output terminal of the NMOS 919 is grounded.

The power supply voltage VDD is applied to one input-output terminal of the PMOS 918. The other input-output terminal of the PMOS 918 is connected to one input-output terminal of the NMOS 920, the other terminal of the ferroelectric capacitor 922, and an output terminal OUT. The other input-output terminal of the NMOS 920 is grounded. The output terminal OUT is connected to a word line WL shown in FIG. 8. That is to say, the number of the word line drive circuits 910 located is equal to that of the word lines WL included in the memory cell arrays.

The operation of the word line drive circuit 910 will now be described in brief.

The adder included in the peripheral circuit section 905 performs an addition process in the above-mentioned way by using addresses of a memory cell selected to specify which word line WL to select. When the word line WL to be driven by the word line drive circuit 910 is selected, the decode terminal DEC of the word line drive circuit 910 changes to the high (H) level. At this time the step-up terminals BST1, BST2, and BST3 are changed to the H level in that order by the timing generation circuit included in the peripheral circuit section 905. Then, three-stage step-up operation is performed by electric charges stored in the ferroelectric capacitors 921 and 922 and the word line WL is driven.

The structure of the capacitor plate line drive circuit is approximately the same as that of the word line drive circuit 910.

As shown in FIG. 8, however, the conventional semiconductor memory using the word lines arranged like stairs includes the dummy areas 903*a* and 903*b* where a memory cell cannot be selected. In addition, the dummy areas 903*a* and 903*b* have the shape of a triangle and blank areas opposite the dummy areas 903*a* and 903*b* also have the shape of a triangle. Accordingly, it is difficult to locate other circuits in these blank areas. As a result, there is a strong possibility that these blank areas really become dead space.

Furthermore, the WL/PL drive circuit sections 904-(*n*+1) through 904-*m* which can drive word lines and capacitor plate lines are located in the areas where only word lines are driven, which causes the increase in the area of a chip.

SUMMARY OF THE INVENTION

The present invention was made under the background circumstances described above. An object of the present invention is to provide a semiconductor memory that includes a memory cell array by which power consumption can be reduced and that enables a reduction in circuit area.

In order to achieve the above object, there is provided a semiconductor memory having a plurality of ferroelectric memory cells, comprising a memory cell array including the plurality of ferroelectric memory cells arranged in a matrix form, capacitor plate lines each arranged so as to connect with ferroelectric memory cells in a same row, and word lines each arranged so as to connect with ferroelectric memory cells in different rows in a column direction; a plurality of capacitor plate line drive circuits for driving the capacitor plate lines; and a plurality of word line drive circuits for driving the word lines, wherein the plurality of capacitor plate line drive circuits are arranged in a direction of a row of the memory cell array and part of the plurality of word line drive circuits are arranged in the column direction.

In addition, in order to achieve the above object, there is provided a semiconductor memory having a plurality of ferroelectric memory cells, comprising a memory cell array including the plurality of ferroelectric memory cells arranged in a matrix form, word lines each arranged so as to connect with ferroelectric memory cells in a same row, and capacitor plate lines each arranged so as to connect with ferroelectric memory cells in different rows in a column direction; a plurality of word line drive circuits for driving the word lines; and a plurality of capacitor plate line drive circuits for driving the capacitor plate lines, wherein the plurality of word line drive circuits are arranged in a direction of a row of the memory cell array and part of the plurality of capacitor plate line drive circuits are arranged in the column direction.

The above and other objects, features and advantages of the present invention will become apparent from the following description when taken in conjunction with the accompanying drawings which illustrate preferred embodiments of the present invention by way of example.

DESCRIPTION OF THE PREFERRED EMBODIMENTS

Embodiments of the present invention will now be described with reference to the drawings.

Figure 1:
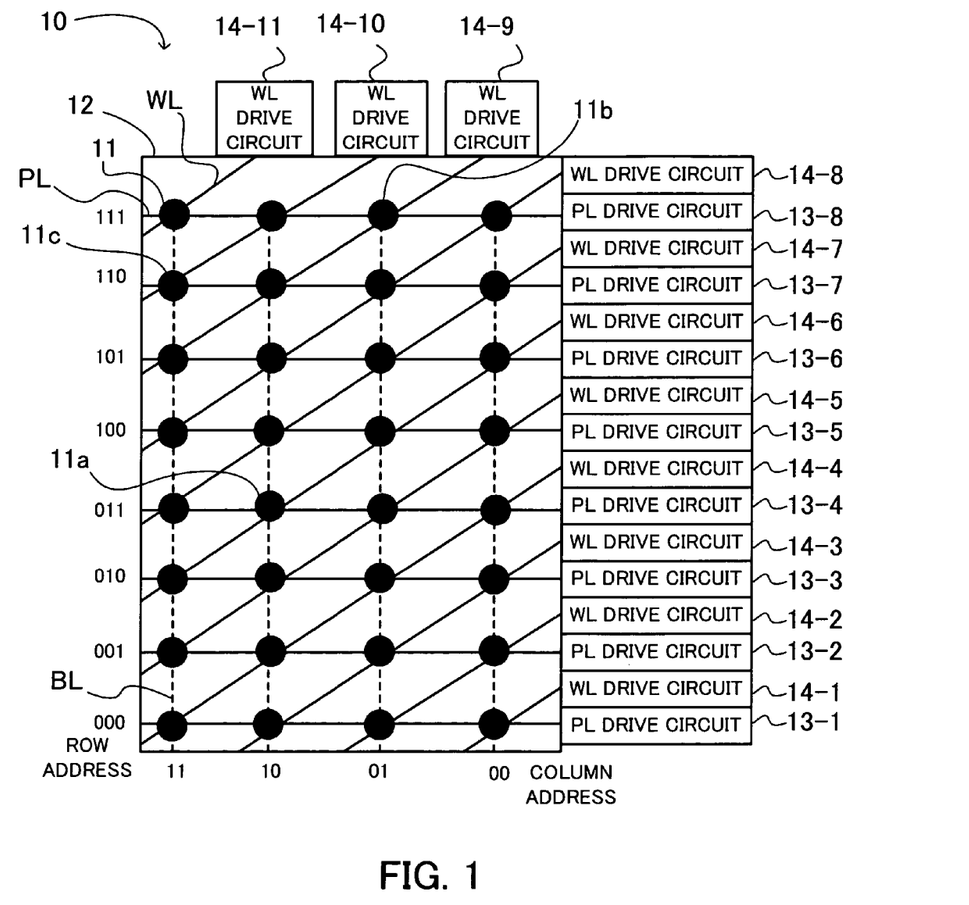
FIG. 1 is a schematic view showing the structure of a semiconductor memory according to the present invention.

FIG. 1 is a schematic view showing the structure of a semiconductor memory according to the present invention.

A semiconductor memory 10 according to the present invention includes a memory cell array 12 in which word lines WL, capacitor plate lines PL, and bit lines BL are connected to a plurality of ferroelectric memory cells 11. To simplify the description, FIG. 1 shows the memory cell array 12 which includes (8×4) ferroelectric memory cells 11. As shown in FIG. 7, each ferroelectric memory cell 11 includes MOS transistors and ferroelectric capacitors. In FIG. 1, however, each ferroelectric memory cell 11 is simplified.

In the memory cell array 12, the bit lines BL are arranged in a column direction. Each of the capacitor plate lines PL is arranged so that it will connect with ferroelectric memory cells 11 in the same row. Each of the word lines WL is arranged so that it will connect with ferroelectric memory cells 11 in different rows in the column direction. As shown in FIG. 7, the word lines WL are actually arranged like stairs. In FIG. 1, however, word lines WL are indicated by slant lines.

In addition, the semiconductor memory 10 includes PL drive circuits 13-1, 13-2, 13-3, 13-4, 13-5, 13-6, 13-7, and 13-8 for driving the capacitor plate lines PL and WL drive circuits 14-1, 14-2, 14-3, 14-4, 14-5, 14-6, 14-7, 14-8, 14-9, 14-10, and 14-11 for driving the word lines WL.

The PL drive circuits 13-1 through 13-8 and the WL drive circuits 14-1 through 14-8 are arranged in the direction of a row of the memory cell array 12 and the WL drive circuits 14-9 through 14-11 are arranged in the direction of a column of the memory cell array 12. FIG. 1 shows row addresses and column addresses which are represented in binary numbers.

In FIG. 1, the 8×4 ferroelectric memory cells of the memory cell array 12 are represented by the three-digit row addresses of "000" to "111" and the two-digit column addresses of "00" to "11".

The operation of the semiconductor memory 10 will now be described.

It is assumed that a ferroelectric memory cell 11a located at the row address "011" and the column address "10" is accessed. A capacitor plate line PL is driven by the PL drive circuit 13-4 located at the row address "011". Each of the word lines WL is arranged so that it will connect with ferroelectric memory cells 11 in different rows in the column direction. Accordingly, a word line WL to be driven is determined on the basis of a value obtained by adding the row address "011" and the column address "10" together.

As stated above, to select the ferroelectric memory cell 11a located at the row address "011" and the column address "10," an adder included in a peripheral circuit section described later adds these addresses together. "011"+"10"="101," so a word line WL is driven by the WL drive circuit 14-6 located at the row address "101". As a result, the ferroelectric memory cell 11a is selected. By applying voltage between a bit line BL connected to the ferroelectric memory cell 11a and the driven capacitor plate line PL at write time, predetermined data is written to ferroelectric capacitors (not shown) included in the ferroelectric memory cell 11a. At read time, the data written to the ferroelectric capacitors is read out by the bit line BL.

Next, the case where a ferroelectric memory cell 11b located at the row address "111" and the column address "01" is accessed will be described. In this case, a capacitor plate line PL is driven by the PL drive circuit 13-8 located at the row address "111". As stated above, a word line WL to be driven is determined on the basis of a value obtained by adding the row address "111" and the column address "01" together. "111"+"01"="1000" and the value "1000" is greater than the maximum value "111" for a row address in the memory cell array 12. In this case, a word line WL is driven by the WL drive circuit 14-9 located at the column address "00" of the WL drive circuits 14-9 through 14-11 arranged in the column direction. As a result, the ferroelectric memory cell 11b is selected and the above write operation or read operation is performed.

Similarly, to select a ferroelectric memory cell 11c for which the result of "1001" is obtained by adding a row address and a column address together, a word line WL is driven by the WL drive circuit 14-10 located at the column address "01".

In the memory cell array 12 in the above semiconductor memory 10, each of the capacitor plate lines PL is arranged so as to connect with ferroelectric memory cells 11 in the same row, and each of the word lines WL is arranged so as to connect with ferroelectric memory cells 11 in different rows in the column direction. Accordingly, the number of ferroelectric memory cells 11 simultaneously selected is small and power consumption can be reduced. In addition, of the drive circuits for driving the word lines WL and the capacitor plate lines PL, the WL drive circuits 14-9 through 14-11, which are part of the WL drive circuits 14-1 through 14-11, are arranged in the column direction. Therefore, it is possible to drive all of the word lines WL without using a dummy area. As a result, circuit area can be reduced.

Semiconductor memories according to embodiments of the present invention will now be described in detail.

Figure 2:
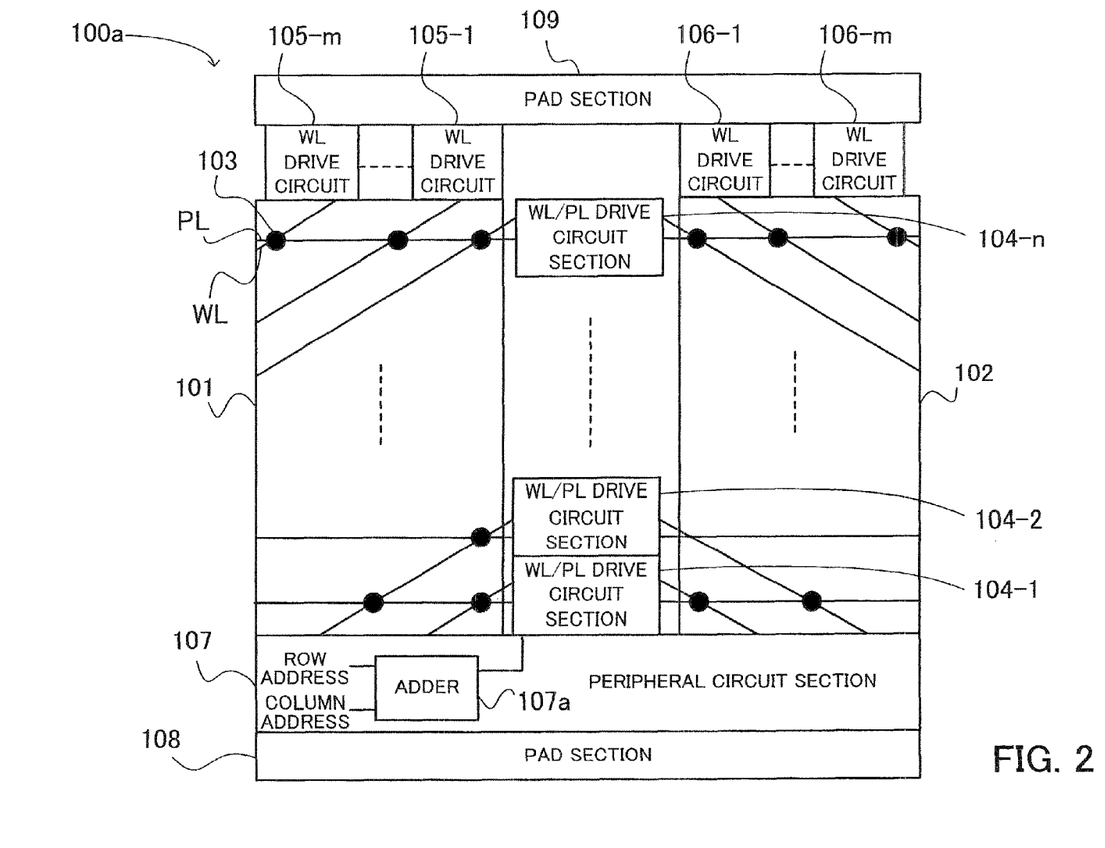
FIG. 2 shows the structure of a semiconductor memory according to a first embodiment of the present invention.

FIG. 2 shows the structure of a semiconductor memory according to a first embodiment of the present invention.

A semiconductor memory 100a according to the first embodiment of the present invention includes two memory cell arrays 101 and 102. As shown in FIG. 1, each of the memory cell arrays 101 and 102 includes capacitor plate lines PL each arranged so as to connect with ferroelectric memory cells 103 in the same row and word lines WL each arranged so as to connect with ferroelectric memory cells 103 in different rows in the column direction. Bit lines are not shown in the memory cell arrays 101 and 102.

WL/PL drive circuit sections 104-1, 104-2, . . . , and 104-n for driving the word lines WL and the capacitor plate lines PL included in the memory cell arrays 101 and 102 are arranged in the row direction between the two memory cell arrays 101 and 102. WL drive circuits 105-1 through 105-m and 106-1 through 106-m for driving part of the word lines WL in the memory cell arrays 101 and 102 which cannot be driven by the WL/PL drive circuit sections 104-1 through 104-n arranged in the row direction are arranged in the column direction above the memory cell arrays 101 and 102 respectively. By doing so, all of the n capacitor plate lines PL and (n+m) word lines WL in the memory cell arrays 101 and 102 can be driven.

Each of the WL/PL drive circuit sections 104-1 through 104-n includes a word line drive circuit and a capacitor plate line drive circuit like those shown in FIG. 1. The structure of the word line drive circuit is approximately the same as that of the capacitor plate line drive circuit. Concrete circuit structure is the same as that shown in FIG. 9.

The semiconductor memory 100a also includes a peripheral circuit section 107 and pad sections 108 and 109 for inputting various kinds of voltages and outputting a signal read out from a ferroelectric memory cell 103.

The peripheral circuit section 107 includes a decoder for selecting a word line WL or a capacitor plate line PL to be driven on the basis of addresses designated from the outside at the time of selecting a ferroelectric memory cell 103, an adder 107a for adding the row address and the column address together in the above way at the time of selecting the word line WL, a sense amplifier, a column selection circuit, and a timing generation circuit.

The operation of the semiconductor memory 100a according to the first embodiment of the present invention is approximately the same as that of the semiconductor memory 10 shown in FIG. 1. That is to say, to access a ferroelectric memory cell 103, a capacitor plate line PL is driven by one of the WL/PL drive circuit sections 104-1 through 104-n located at a row address of the ferroelectric memory cell 103. If a row address having a value obtained by adding together a column address and the row address of the ferroelectric memory cell 103 to be accessed exists in the memory cell array 101 or 102, then a word line WL is driven by one of the WL/PL drive circuit sections 104-1 through 104-n located at the row address. If a value obtained by adding together the column address and the row address of the ferroelectric memory cell 103 to be accessed is greater than a maximum value for a row address in the memory cell array 101 or 102, then one of the WL drive circuits 105-1 through 105-m and 106-1 through 106-m arranged in the column direction above the memory cell arrays 101 and 102 respectively is selected according to the value to drive a word line WL. Write operation or read operation is performed on the ferroelectric memory cell 103 selected in this way.

In the memory cell arrays 101 and 102 included in the above semiconductor memory 100a according to the first embodiment of the present invention, each capacitor plate line PL is arranged so as to connect with ferroelectric memory cells 103 in the same row and each word line WL is arranged so as to connect with ferroelectric memory cells 103 in different rows in the column direction. As a result, the number of ferroelectric memory cells 103 simultaneously selected is small and power consumption can be reduced. In addition, of the drive circuits for driving the word lines WL and the capacitor plate lines PL, the WL drive circuits 105-1 through 105-m and 106-1 through 106-m, which are part of the WL drive circuits, are arranged in the column direction. Therefore, it is possible to drive all of the word lines WL without using a dummy area or WL/PL drive circuit sections (see FIG. 8) located in a dummy area. As a result, circuit area can be reduced.

A semiconductor memory according to a second embodiment of the present invention will now be described.

In the semiconductor memory 10 shown in FIG. 1 or the semiconductor memory 100a according to the first embodiment of the present invention, the word lines are arranged like stairs in the memory cell array. However, the capacitor plate lines may be arranged like stairs.

In particular, if ferroelectric memory cells each having a stack structure, for example, are used, a wiring layer can be used for forming capacitor plate lines. Therefore, unlike the case where planar ferroelectric memory cells are used, it is easy to arrange capacitor plate lines like stairs instead of word lines.

Figure 3:
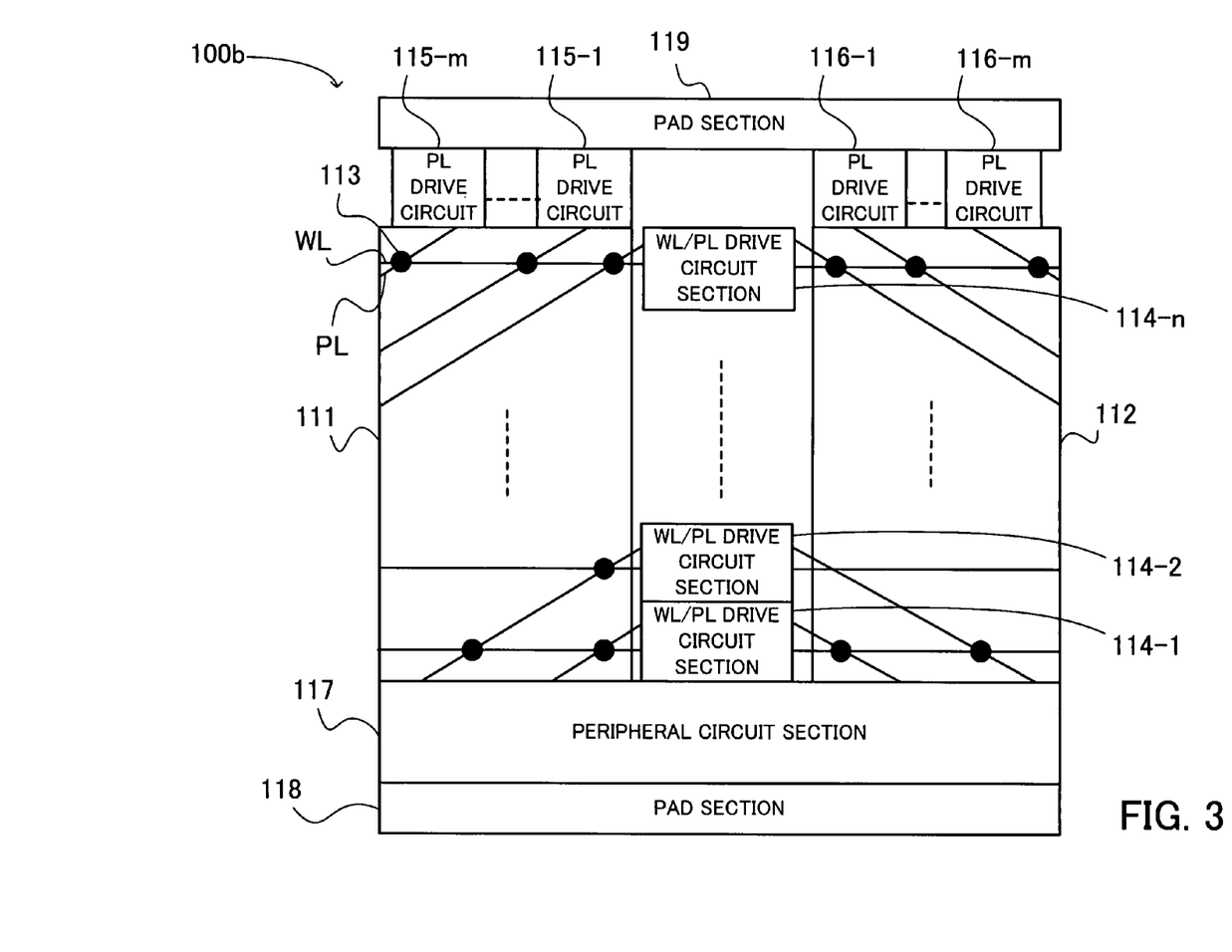
FIG. 3 shows the structure of a semiconductor memory according to a second embodiment of the present invention.

FIG. 3 shows the structure of a semiconductor memory according to the second embodiment of the present invention.

A semiconductor memory 100b according to the second embodiment of the present invention includes two memory cell arrays 111 and 112. This is the same with the semiconductor memory 100a according to the first embodiment of the present invention. The semiconductor memory 100b according to the second embodiment of the present invention differs from the semiconductor memory 100a according to the first embodiment of the present invention in that each of the memory cell arrays 111 and 112 includes word lines WL each arranged so as to connect with ferroelectric memory cells 113 in the same row and capacitor plate lines PL each arranged so as to connect with ferroelectric memory cells 113 in different rows in the column direction. Bit lines are not shown in the memory cell arrays 111 and 112.

WL/PL drive circuit sections 114-1, 114-2, . . . , and 114-n for driving the word lines WL and the capacitor plate lines PL included in the memory cell arrays 111 and 112 are arranged in the row direction between the two memory cell arrays 111 and 112. PL drive circuits 115-1 through 115-m and 116-1 through 116-m for driving part of the capacitor plate lines PL in the memory cell arrays 111 and 112 which cannot be driven by the WL/PL drive circuit sections 114-1 through 114-n arranged in the row direction are arranged in the column direction above the memory cell arrays 111 and 112 respectively. By doing so, all of the n word lines WL and (n+m) capacitor plate lines PL in the memory cell arrays 111 and 112 can be driven.

The semiconductor memory 100b according to the second embodiment of the present invention also includes a peripheral circuit section 117 and pad sections 118 and 119 for inputting various kinds of voltages and outputting a signal read out from a ferroelectric memory cell 113.

The peripheral circuit section 117 includes a decoder for selecting a word line WL or a capacitor plate line PL to be driven on the basis of addresses designated from the outside at the time of selecting a ferroelectric memory cell 113, an adder for adding the row address and the column address together at the time of selecting the capacitor plate line PL, a sense amplifier, a column selection circuit, and a timing generation circuit.

Each of the WL/PL drive circuit sections 114-1 through 114-n includes a word line drive circuit and a capacitor plate line drive circuit like those shown in FIG. 1. The structure of the word line drive circuit is the same as that shown in FIG. 9. However, if each ferroelectric memory cell 113 has a stack structure, the capacitor plate line drive circuit can drive a capacitor plate line PL by using power supply voltage. As a result, the following small-scale circuit, for example, is used as the capacitor plate line drive circuit.

Figure 4:
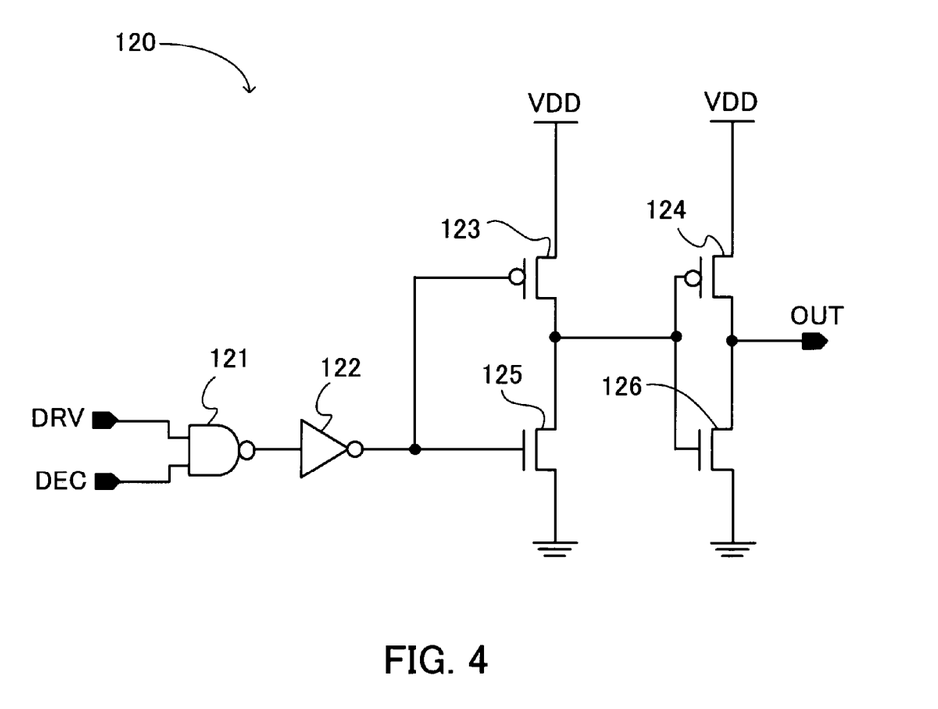
FIG. 4 is a circuit diagram of an example of a PL drive circuit included in the semiconductor memory according to the second embodiment of the present invention.

FIG. 4 is a circuit diagram of an example of a PL drive circuit included in the semiconductor memory according to the second embodiment of the present invention.

A PL drive circuit 120 includes a NAND circuit 121, an inverter circuit 122, PMOSes 123 and 124, and NMOSes 125 and 126.

One input terminal of the NAND circuit 121 is connected to a terminal DRV and the other input terminal of the NAND circuit 121 is connected to a decode terminal DEC. An output terminal of the NAND circuit 121 is connected to gates of the PMOS 123 and the NMOS 125 via the inverter circuit 122.

Power supply voltage VDD is applied to one input-output terminal of the PMOS 123 and the other input-output terminal of the PMOS 123 is connected to one input-output terminal of the NMOS 125 and gates of the PMOS 124 and the NMOS 126. The other input-output terminal of the NMOS 125 is grounded.

The power supply voltage VDD is applied to one input-output terminal of the PMOS 124 and the other input-output terminal of the PMOS 124 is connected to one input-output terminal of the NMOS 126 and an output terminal OUT. The other input-output terminal of the NMOS 126 is grounded. The output terminal OUT is connected to a capacitor plate line PL shown in FIG. 3.

Each of the PL drive circuits 115-1 through 115-m and 116-1 through 116-m arranged in the column direction also has the above structure.

The operation of the PL drive circuit 120 will now be described in brief.

The adder included in the peripheral circuit section 117 performs the above addition process by using addresses of a memory cell to be selected to designate a capacitor plate line PL to be selected. When the capacitor plate line PL to be driven by the PL drive circuit 120 is selected, the decode terminal DEC of the PL drive circuit 120 changes to the H level. If at this time the terminal DRV is changed to the H level by the timing generation circuit included in the peripheral circuit section 117, then the power supply voltage VDD is obtained at the output terminal OUT and the capacitor plate line PL is driven.

The capacitor plate line PL can be driven in this way by the power supply voltage VDD. This obviates step-up circuits like those shown in FIG. 9 (inverter circuits 915 and 916, ferroelectric capacitors 921 and 922, and the like) and circuit scale can be reduced.

The operation of the semiconductor memory 100b according to the second embodiment of the present invention will now be described. To access a ferroelectric memory cell 113, a word line WL is driven by one of the WL/PL drive circuit sections 114-1 through 114-n located at a row address of the ferroelectric memory cell 113. If a row address having a value obtained by adding together a column address and the row address of the ferroelectric memory cell 113 to be accessed exists in the memory cell array 111 or 112, then a capacitor plate line PL is driven by one of the WL/PL drive circuit sections 114-1 through 114-n located at the row address. If a value obtained by adding together the column address and the row address of the ferroelectric memory cell 113 to be accessed is greater than a maximum value for a row address in the memory cell array 111 or 112, then one of the PL drive circuits 115-1 through 115-m and 116-1 through 116-m arranged in the column direction above the memory cell arrays 111 and 112 respectively is selected according to the value to drive a capacitor plate line PL. Write operation or read operation is performed on the ferroelectric memory cell 113 selected in this way.

In the memory cell arrays 111 and 112 included in the above semiconductor memory 100b according to the second embodiment of the present invention, each word line WL is arranged so as to connect with ferroelectric memory cells 113 in the same row and each capacitor plate line PL is arranged so as to connect with ferroelectric memory cells 113 in different rows in the column direction. As a result, the number of ferroelectric memory cells 113 simultaneously selected is small and power consumption can be reduced. In addition, of the drive circuits for driving the word lines WL and the capacitor plate lines PL, the PL drive circuits 115-1 through 115-m and 116-1 through 116-m, which are part of the PL drive circuits, are arranged in the column direction. Therefore, unlike the case of FIG. 8, it is possible to drive all of the capacitor plate lines PL without using a dummy area or WL/PL drive circuit sections located in a dummy area. This reduces circuit area. Moreover, as shown in FIG. 4, the scale of the PL drive circuit can be reduced by using ferroelectric memory cells 113 each having a stack structure. Accordingly, the circuit area of the semiconductor memory 100b can be reduced further.

A semiconductor memory according to a third embodiment of the present invention will now be described.

Figure 5:
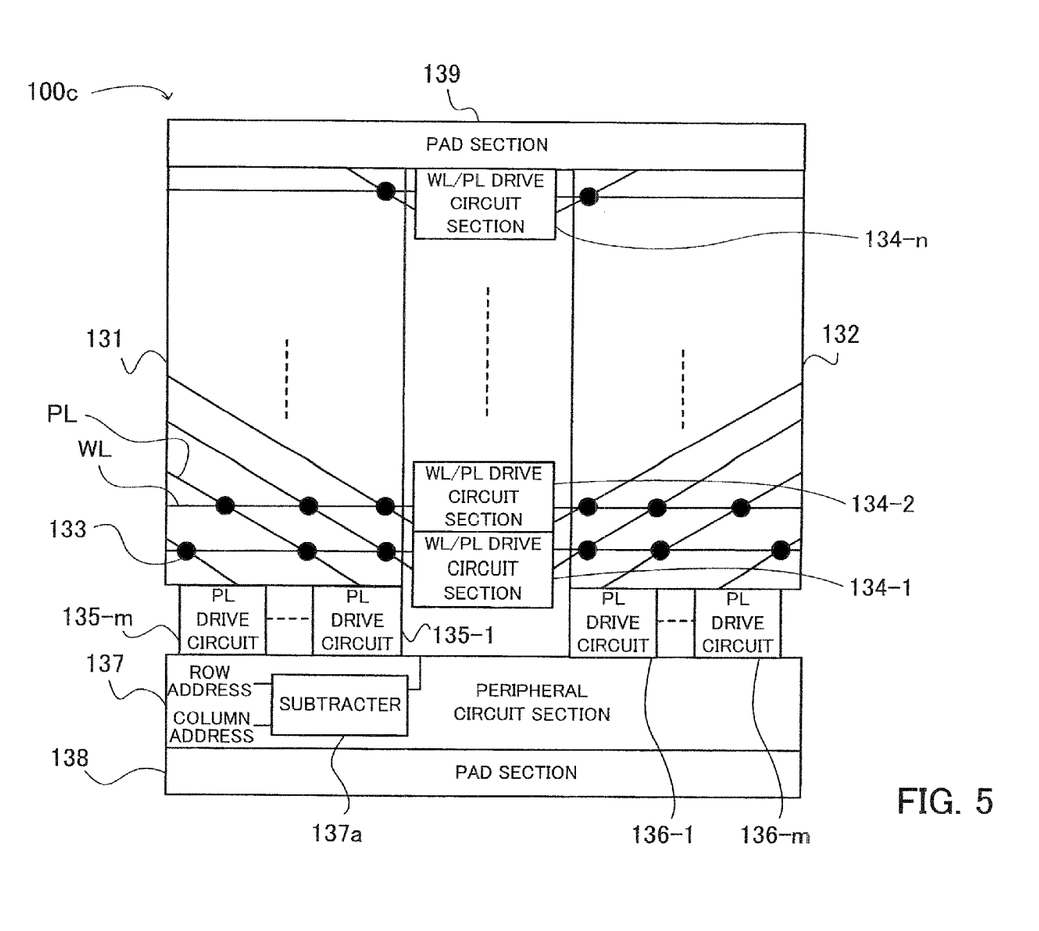
FIG. 5 shows the structure of a semiconductor memory according to a third embodiment of the present invention.

FIG. 5 shows the structure of a semiconductor memory according to the third embodiment of the present invention.

A semiconductor memory 100c according to the third embodiment of the present invention includes two memory cell arrays 131 and 132. This is the same with the semiconductor memories 100a and 100b according to the first embodiment and the second embodiment, respectively, of the present invention. Each of the memory cell arrays 131 and 132 includes word lines WL each arranged so as to connect with ferroelectric memory cells 133 in the same row and capacitor plate lines PL each arranged so as to connect with ferroelectric memory cells 133 in different rows in the column direction. This is the same with the semiconductor memory 100b according to the second embodiment of the present invention. Compared with the memory cell arrays 111 and 112 included in the semiconductor memory 100b according to the second embodiment of the present invention, however, the memory cell arrays 131 and 132 are turned upside down in the semiconductor memory 100c according to the third embodiment of the present invention.

WL/PL drive circuit sections 134-1, 134-2, . . . , and 134-n for driving the word lines WL and the capacitor plate lines PL included in the memory cell arrays 131 and 132 are arranged in the row direction between the two memory cell arrays 131 and 132. PL drive circuits 135-1 through 135-m and 136-1 through 136-m for driving part of the capacitor plate lines PL in the memory cell arrays 131 and 132 which cannot be driven by the WL/PL drive circuit sections 134-1 through 134-n arranged in the row direction are arranged in the column direction. However, the semiconductor memory 100c according to the third embodiment of the present invention differs from the semiconductor memory 100b according to the second embodiment of the present invention in that the PL drive circuits 135-1 through 135-m for driving m capacitor plate lines PL are arranged in the column direction between the memory cell array 131 and a peripheral circuit section 137 and that the PL drive circuits 136-1 through 136-m for driving m capacitor plate lines PL are arranged in the column direction between the memory cell array 132 and the peripheral circuit section 137.

In addition, the semiconductor memory 100c according to the third embodiment of the present invention includes the peripheral circuit section 137 and pad sections 138 and 139 for inputting various kinds of voltages and outputting a signal read out from a ferroelectric memory cell 133. This is the same with the semiconductor memory 100a according to the first embodiment of the present invention or the semiconductor memory 100b according to the second embodiment of the present invention.

Circuits included in the peripheral circuit section 137 in the semiconductor memory 100c according to the third embodiment of the present invention are approximately the same as those included in the peripheral circuit section 107 in the semiconductor memory 100a according to the first embodiment of the present invention or the peripheral circuit section 117 in the semiconductor memory 100b according to the second embodiment of the present invention. Compared with the semiconductor memory 100a according to the first embodiment of the present invention or the semiconductor memory 100b according to the second embodiment of the present invention, however, the memory cell arrays 131 and 132 are turned upside down. Therefore, the peripheral circuit section 137 includes a subtracter 137a for subtracting a column address from a row address in place of an adder.

The operation of the semiconductor memory 100c according to the third embodiment of the present invention will now be described. To access a ferroelectric memory cell 133, a word line WL is driven by one of the WL/PL drive circuit sections 134-1 through 134-n located at a row address of the ferroelectric memory cell 133.

The semiconductor memory 100c according to the third embodiment of the present invention differs from the semiconductor memory 100a according to the first embodiment of the present invention or the semiconductor memory 100b according to the second embodiment of the present invention in how to select a capacitor plate line PL to be driven. To simplify the description, it is assumed that (8×4) ferroelectric memory cells 133 are arranged in the memory cell array 131. The following describes how to select a capacitor plate line PL to be driven.

Figure 6:
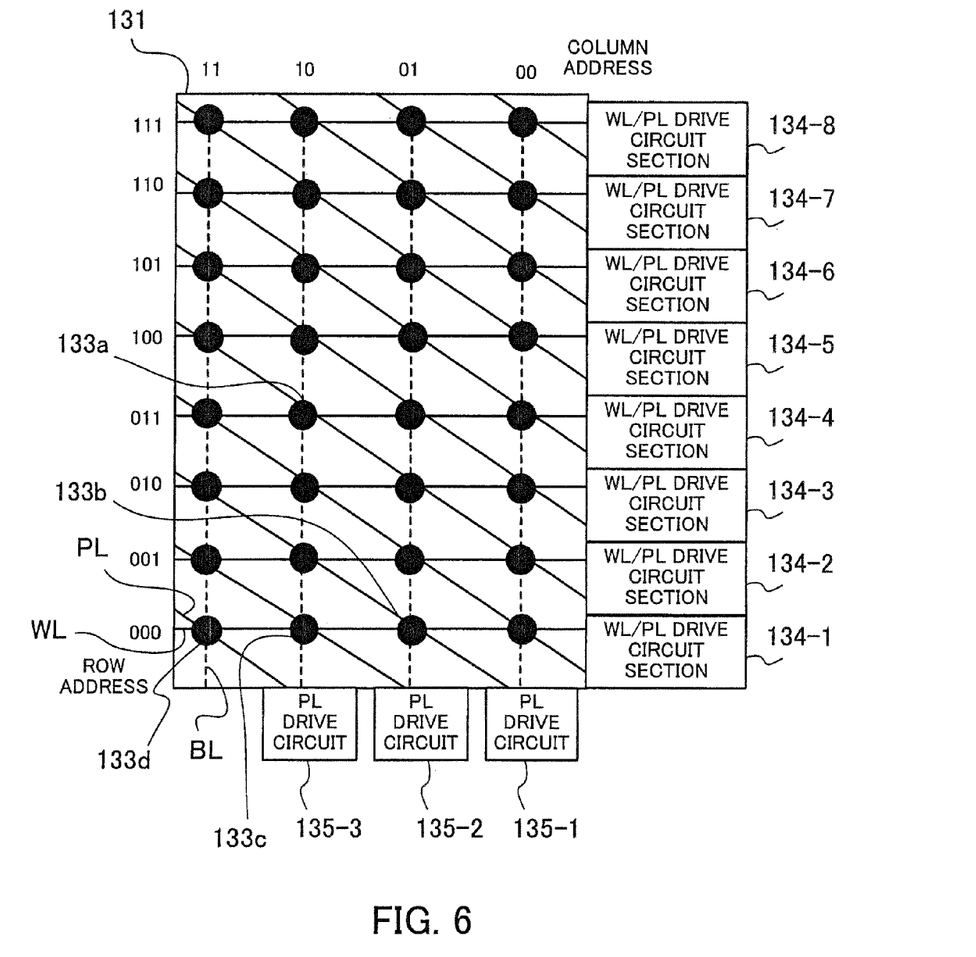
FIG. 6 is a schematic view showing a memory cell array and each drive circuit included in the semiconductor memory according to the third embodiment of the present invention.

FIG. 6 is a schematic view showing a memory cell array and each drive circuit included in the semiconductor memory according to the third embodiment of the present invention. In the memory cell array, row addresses and column addresses are represented in binary numbers. In FIG. 6, the 8×4 ferroelectric memory cells of the memory cell array are represented by the three-digit row addresses of "000" to "111" and the two-digit column addresses of "00" to "11".

To access a ferroelectric memory cell 133a located at, for example, the row address "011" and the column address "10," a word line WL is driven by the WL/PL drive circuit section 134-4 located at the row address "011". A capacitor plate line PL to be driven is determined on the basis of a value obtained by subtracting the column address "10" from the row address "011".

As stated above, to select the ferroelectric memory cell 133a located at the row address "011" and the column address "10," the subtracter 137a included in the peripheral circuit section 137 shown in FIG. 5 subtracts the column address "10" from the row address "011". "011"−"10"="001," so a capacitor plate line PL is driven by the WL/PL drive circuit section 134-2 located at the row address "001". As a result, the ferroelectric memory cell 133a is selected. By applying voltage between a bit line BL connected to the ferroelectric memory cell 133a and the driven capacitor plate line PL at write time, predetermined data is written to ferroelectric capacitors (not shown) included in the ferroelectric memory cell 133a. At read time, the data written to the ferroelectric capacitors is read out by the bit line BL.

Next, the case where a ferroelectric memory cell 133b located at the row address "000" and the column address "01" is accessed will be described. In this case, a word line WL is driven by the WL/PL drive circuit section 134-1 located at the row address "000". As stated above, a capacitor plate line PL to be driven is determined on the basis of a value obtained by subtracting the column address "01" from the row address "000". The value obtained is negative and its absolute value is "001". In this case, a capacitor plate line PL is driven by the PL drive circuit 135-1 located at the column address "00" of the PL drive circuits 135-1 through 135-3 arranged in the column direction. As a result, the ferroelectric memory cell 133b is selected and the above write operation or read operation is performed.

Similarly, to select a ferroelectric memory cell 133c for which a negative value the absolute value of which is "010" is obtained by subtracting a column address from a row address, a capacitor plate line PL is driven by the PL drive circuit 135-2 located at the column address "01". To select a ferroelectric memory cell 133d for which a negative value the absolute value of which is "011" is obtained by subtracting a column address from a row address, a capacitor plate line PL is driven by the PL drive circuit 135-3 located at the column address "10".

By using the above semiconductor memory 100c according to the third embodiment of the present invention, the same effect that can be achieved by the semiconductor memory 100b according to the second embodiment of the present invention is obtained. In addition, the PL drive circuits 135-1 through 135-m and 136-1 through 136-m are located near the peripheral circuit section 137, so the length of wirings for a decoder circuit included in the peripheral circuit section 137 can be shortened. As a result, high-speed operation of the circuit because of a reduction in wiring delay can be expected.

In the above example, each of the capacitor plate lines PL included in the memory cell arrays 131 and 132 is arranged so as to connect with ferroelectric memory cells 133 in different rows in the column direction. This is the same with the semiconductor memory 100b according to the second embodiment of the present invention. By turning the memory cell arrays 101 and 102 included in the semiconductor memory 100a according to the first embodiment of the present invention upside down, however, WL drive circuit 105-1 through 105-m may be located between the memory cell array 101 and the peripheral circuit section 107 and WL drive circuit 106-1 through 106-m may be located between the memory cell array 102 and the peripheral circuit section 107.

With the present invention, in the memory cell array in which ferroelectric memory cells are arranged in a matrix, each capacitor plate line is arranged so as to connect with ferroelectric memory cells in the same row and each word line is arranged so as to connect with ferroelectric memory cells in different rows in the column direction. As a result, the number of ferroelectric memory cells simultaneously selected is small and power consumption can be reduced. Furthermore, of the drive circuits for driving the capacitor plate lines and the word lines, part of the word line drive circuits are arranged in the column direction. Therefore, it is possible to drive all of the word lines without using a dummy area, thereby reducing circuit area.

In addition, in the memory cell array in which ferroelectric memory cells are arranged in a matrix form, each word line is arranged so as to connect with ferroelectric memory cells in the same row and each capacitor plate line is arranged so as to connect with ferroelectric memory cells in different rows in the column direction. As a result, the number of ferroelectric memory cells simultaneously selected is small and power consumption can be reduced. Furthermore, of the drive circuits for driving the word lines and the capacitor plate lines, part of the capacitor plate line drive circuits are arranged in the column direction. Therefore, it is possible to drive all of the capacitor plate lines without using a dummy area, thereby reducing circuit area.

The foregoing is considered as illustrative only of the principles of the present invention. Further, since numerous modifications and changes will readily occur to those skilled in the art, it is not desired to limit the invention to the exact construction and applications shown and described, and accordingly, all suitable modifications and equivalents may be regarded as falling within the scope of the invention in the appended claims and their equivalents.

What is claimed is:

1. A semiconductor memory comprising:
a plurality of ferroelectric memory cells each having a row address and a column address,
capacitor plate lines each connected to the ferroelectric memory cells having a same row address, and
word lines each arranged so as to connect the ferroelectric memory cells having adjacent row addresses and adjacent column addresses;
a plurality of capacitor plate line drive circuits for driving the capacitor plate lines; and
a plurality of word line drive circuits for driving the word lines,
wherein:
the plurality of capacitor plate line drive circuits are arranged in a direction of increasing row addresses of the memory cell array which is perpendicular to a direction of increasing column addresses of a memory cell array having the plurality of ferroelectric memory cells;
the plurality of word line drive circuits include a plurality of word line drive circuits that are arranged in the direction of increasing row addresses and a plurality of word line drive circuits that are arranged in the direction of increasing column addresses; and
one of the plurality of word line drive circuits is selected based on a value obtained by adding a row address and a column address of a ferroelectric memory cell to be selected, and the selected word line drive circuit drives a word line connected to the ferroelectric memory cell.

2. The semiconductor memory according to claim 1, further comprising
a peripheral circuit section adjacent to the memory cell array,
wherein the peripheral circuit section includes a circuit section for determining the word line coupled to a ferroelectric memory cell to be selected, and the row address and the column address are supplied to the peripheral circuit section for selecting the ferroelectric memory cell.

3. The semiconductor memory according to claim 2,
wherein a row address has a range corresponding to the memory cell array, and
wherein if the value obtained exceeds a maximum value within the range, the circuit section selects one of the plurality of word line drive circuits arranged in the direction of increasing column addresses for driving the word line.

4. The semiconductor memory according to claim 1, further comprising
a peripheral circuit section adjacent to the memory cell array,
wherein the peripheral circuit section includes a circuit section for selecting at least one of a word line and a capacitor plate line to be driven, which couples to a ferroelectric memory cell to be accessed, according to an address which are supplied to the peripheral circuit section for accessing the ferroelectric memory cell,
wherein part of the plurality of word line drive circuits are arranged in the direction of increasing column addresses between the memory cell array and the circuit section.

5. A semiconductor memory comprising:
a plurality of ferroelectric memory cells each having a row address and a column address,
capacitor plate lines each connected to the ferroelectric memory cells having a same row address, and
word lines each arranged so as to connect the ferroelectric memory cells having adjacent row addresses and adjacent column addresses;
a plurality of capacitor plate line drive circuits for driving the capacitor plate lines; and
a plurality of word line drive circuits for driving the word lines,
wherein:
the plurality of capacitor plate line drive circuits are arranged in a direction of increasing row addresses of the memory cell array which is perpendicular to a direction of increasing column addresses of a memory cell array having the plurality of ferroelectric memory cells;
the plurality of word line drive circuits include a plurality of word line drive circuits that are arranged in the direction of increasing row addresses and a plurality of word line drive circuits that are arranged in the direction of increasing column addresses; and
one of the plurality of word line drive circuits is selected based on a value obtained by subtracting a column address from a row address of a ferroelectric memory cell to be selected, and the selected word line drive circuit drives a word line connected to the ferroelectric memory cell.

6. The semiconductor memory according to claim 5,
wherein if the row address is smaller than the column address, the circuit section selects one of the plurality of word line drive circuits arranged in the direction of increasing column addresses for driving the word line.

7. The semiconductor memory according to claim 5, further comprising
a peripheral circuit section adjacent to the memory cell array,
wherein the peripheral circuit section includes a circuit section for determining the word line coupled to a ferroelectric memory cell to be selected, and the row address and the column address are supplied to the peripheral circuit section for selecting the ferroelectric memory cell.

8. A semiconductor memory comprising:
a plurality of ferroelectric memory cells each having a row address and a column address,
word lines each connected to the ferroelectric memory cells having a same row address, and capacitor plate lines each arranged so as to connect the ferroelectric memory cells having adjacent row addresses and adjacent column addresses;

a plurality of word line drive circuits for driving the word lines; and a plurality of capacitor plate line drive circuits for driving the capacitor plate lines, wherein:

the plurality of word line drive circuits are arranged in a direction of increasing row addresses of the memory cell array which is perpendicular to a direction of increasing column addresses of a memory cell array having the plurality of ferroelectric memory cells;

the plurality of capacitor plate line drive circuits include a plurality of capacitor plate line drive circuits that are arranged in the direction of increasing row addresses and a plurality of capacitor plate line drive circuits that are arranged in the direction of increasing column addresses, and one of the plurality of capacitor plate line drive circuits is selected based on a value obtained by adding a row address and a column address of a ferroelectric memory cell to be selected, and the selected capacitor plate line drive circuit drives a capacitor plate line connected to the ferroelectric memory cell.

9. The semiconductor memory according to claim 8, further comprising a peripheral circuit section adjacent to the memory cell array, wherein the peripheral circuit section includes a circuit section for determining the capacitor plate line coupled to a ferroelectric memory cell to be selected the row address and the column address are supplied to the peripheral circuit section for selecting the ferroelectric memory cell.

10. The semiconductor memory according to claim 9, wherein a row address has a range corresponding to the memory cell array, and wherein if the value obtained exceeds a maximum value within the range, the circuit section selects one of the plurality of capacitor plate line drive circuits arranged in the direction of increasing column addresses for driving the capacitor plate line.

11. The semiconductor memory according to claim 8, further comprising a peripheral circuit section adjacent to the memory cell array, wherein the peripheral circuit section includes a circuit section for selecting at least one of a word line and a capacitor plate line to be driven, which couples to a ferroelectric memory cell to be accessed, according to an address which are supplied to the peripheral circuit section for accessing the ferroelectric memory cell, wherein part of the plurality of capacitor plate line drive circuits are arranged in the direction of increasing column addresses between the memory cell array and the circuit section.

12. A semiconductor memory comprising:

a plurality of ferroelectric memory cells each having a row address and a column address, word lines each connected to the ferroelectric memory cells having a same row address, and capacitor plate lines each arranged so as to connect the ferroelectric memory cells having adjacent row addresses and adjacent column addresses;

a plurality of word line drive circuits for driving the word lines; and a plurality of capacitor plate line drive circuits for driving the capacitor plate lines, wherein:

the plurality of word line drive circuits are arranged in a direction of increasing row addresses of the memory cell array which is perpendicular to a direction of increasing column addresses of a memory cell array having the plurality of ferroelectric memory cells;

the plurality of capacitor plate line drive circuits include a of capacitor plate line drive circuits that are arranged in the direction of increasing row addresses and a plurality of capacitor plate line drive circuits that are arranged in the direction of increasing column addresses, and one of the plurality of capacitor plate line drive circuits is selected based on a value obtained by subtracting a column address from a row address of a ferroelectric memory cell to be selected, and the selected capacitor plate line drive circuit drives a capacitor plate line connected to the ferroelectric memory cell.

13. The semiconductor memory according to claim 12, wherein if the row address is smaller than the column address, the circuit section selects one of the plurality of capacitor plate line drive circuits arranged in the direction of increasing column addresses for driving the capacitor plate line.

14. The semiconductor memory according to claim 12 further comprising a peripheral circuit section adjacent to the memory cell array, wherein the peripheral circuit section includes a circuit section for determining the capacitor plate line coupled to a ferroelectric memory cell to be selected, and the row address and the column address are supplied to the peripheral circuit section for selecting the ferroelectric memory cell.

* * * * *